(12) United States Patent
Marchand et al.

(10) Patent No.: US 7,148,677 B2
(45) Date of Patent: Dec. 12, 2006

(54) VACUUM CIRCUIT INTERRUPTER INCLUDING CIRCUIT MONITORING LEAKAGE OR LOSS OF VACUUM AND METHOD OF MONITORING A VACUUM INTERRUPTER FOR LEAKAGE OR LOSS OF VACUUM

(75) Inventors: Francois J. Marchand, Jiangsu (CN); James J. Benke, Pittsburgh, PA (US); Russell W. Long, Pleasant Hills, PA (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 11/058,610

(22) Filed: Feb. 15, 2005

(65) Prior Publication Data

US 2006/0181267 A1   Aug. 17, 2006

(51) Int. Cl.
*G01R 31/28* (2006.01)
(52) U.S. Cl. ............................ 324/158.1
(58) Field of Classification Search ............... None
See application file for complete search history.

(56) References Cited

U.S. PATENT DOCUMENTS

| | | | | | |
|---|---|---|---|---|---|
| 3,626,125 | A | * | 12/1971 | Tonegawa ............... | 218/122 |
| 3,641,359 | A | * | 2/1972 | McCarty ................. | 361/120 |
| 3,813,506 | A | * | 5/1974 | Mitchell ................. | 218/10 |
| 3,814,885 | A | * | 6/1974 | Sofianek ................ | 218/122 |
| 3,845,263 | A | * | 10/1974 | Dickinson ............... | 218/119 |
| 3,983,345 | A | * | 9/1976 | Phillips ................. | 218/122 |
| 4,159,498 | A | * | 6/1979 | Noeske ................... | 218/140 |
| 4,403,124 | A | | 9/1983 | Perkins et al. | |
| 4,440,995 | A | * | 4/1984 | Lange et al. ........... | 218/122 |
| 4,471,309 | A | | 9/1984 | Lange et al. | |
| 4,484,818 | A | * | 11/1984 | Houston ................. | 340/644 |
| 4,491,704 | A | | 1/1985 | Milianowicz et al. | |
| 4,547,769 | A | * | 10/1985 | Tanigaki et al. ........ | 340/626 |
| 4,587,390 | A | * | 5/1986 | Gray ..................... | 218/84 |
| 4,879,441 | A | * | 11/1989 | Hamm et al. ........... | 218/119 |
| 4,975,552 | A | * | 12/1990 | Niegl et al. ........... | 218/141 |
| 6,373,358 | B1 | | 4/2002 | Davies et al. | |

OTHER PUBLICATIONS

HORTEC B.V., "Instructions for use of integrated VDS", Nov. 15, 2000, 19 pp.
Eaton Corporation, "Integrated Partial Discharge Sensors IPDS-15 and Reference Voltage Sensors RVS", Jan. 2003, 4 pp.

* cited by examiner

*Primary Examiner*—Jermele Hollington
(74) *Attorney, Agent, or Firm*—Martin J. Moran

(57) ABSTRACT

A method monitors a vacuum interrupter for leakage or loss of vacuum. The vacuum interrupter includes a line side, a load side and separable contacts electrically connected therebetween. The line side has a line side voltage and the load side has a load side voltage. The method includes determining whether the separable contacts of the vacuum interrupter are intended to be open or closed, comparing the line side voltage to the load side voltage, and determining the leakage or the loss of vacuum when the separable contacts of the vacuum interrupter are intended to be open and when the load side voltage is within a predetermined amount of the line side voltage.

2 Claims, 6 Drawing Sheets

VACUUM CIRCUIT INTERRUPTER INCLUDING CIRCUIT MONITORING LEAKAGE OR LOSS OF VACUUM AND METHOD OF MONITORING A VACUUM INTERRUPTER FOR LEAKAGE OR LOSS OF VACUUM

BACKGROUND OF THE INVENTION

1. Field of the Invention

This invention pertains generally to circuit interrupters and, more particularly, to such circuit interrupters employing one or more poles each of which includes a vacuum interrupter. The invention also pertains to a method of monitoring a vacuum interrupter for leakage or loss of vacuum of the vacuum envelope.

2. Background Information

Circuit interrupters provide protection for electrical systems from electrical fault conditions such as, for example, current overloads, short circuits and abnormal level voltage conditions. Typically, circuit interrupters include a spring powered operating mechanism which opens electrical contacts to interrupt the current through the conductors of an electrical system in response to abnormal conditions, although a wide range of driving mechanisms may be employed.

Circuit interrupters, such as, for example, power circuit breakers for systems operating above about 1,000 volts typically utilize vacuum interrupters as the switching devices. Vacuum switching devices (e.g., circuit interrupters; circuit breakers; switches; reclosers) include separable main contacts disposed within an insulating housing. Generally, one of the contacts is fixed relative to both the housing and to an external electrical conductor which is interconnected with the circuit to be controlled by the circuit interrupter. The other contact is moveable. In the case of a vacuum circuit interrupter, the moveable contact assembly usually comprises a stem of circular cross-section having the contact at one end enclosed within a vacuum chamber and a driving mechanism at the other end which is external to the vacuum chamber. An operating rod assembly comprising a push rod, which is fastened to the end of the stem opposite the moveable contact, and a driving mechanism provide the motive force to move the moveable contact into or out of engagement with the fixed contact.

Vacuum interrupters are typically used, for instance, to reliably interrupt medium voltage alternating current (AC) currents and, also, high voltage AC currents of several thousands of amperes or more. Typically, one vacuum interrupter is provided for each phase of a multi-phase circuit and the vacuum interrupters for the several phases are actuated simultaneously by a common operating mechanism, or separately by separate operating mechanisms (and auxiliary switches).

A leaking vacuum interrupter is extremely rare. However, if a leak does occur, then the vacuum interrupter may not be able to interrupt a corresponding current flow and/or it may not be able to withstand the required voltage when its separable contacts are open.

There is a need, therefore, to detect a loss of vacuum or a leaking vacuum of a vacuum interrupter.

SUMMARY OF THE INVENTION

These needs and others are met by the present invention, which monitors a vacuum interrupter for leakage or loss of vacuum. The vacuum interrupter includes a line side, a load side and separable contacts electrically connected therebetween, the line side having a line side voltage, the load side having a load side voltage. As one aspect of the invention, a method comprises: determining whether the separable contacts of the vacuum interrupter are intended to be open or closed; comparing the line side voltage to the load side voltage; and determining the leakage or the loss of vacuum when the separable contacts of the vacuum interrupter are intended to be open and when the load side voltage is within a predetermined amount of the line side voltage.

The method may output a signal representing no leakage or loss of vacuum when the separable contacts of the vacuum interrupter are intended to be closed and when the line side voltage is not greater than the load side voltage by greater than the predetermined amount.

The method may output a signal representing no leakage or loss of vacuum when the separable contacts of the vacuum interrupter are intended to be open and when the load side voltage is not within the predetermined amount of the line side voltage.

The method may determine the leakage or the loss of vacuum when the separable contacts of the vacuum interrupter are intended to be closed and when the line side voltage is greater than the load side voltage by greater than the predetermined amount.

The method may employ with the vacuum interrupter a shield including a shield voltage; determine that the separable contacts of the vacuum interrupter are intended to be open; employ as the predetermined amount a first predetermined amount; and output a signal representing no leakage or loss of vacuum when the shield voltage is not within a second predetermined amount of the line side voltage.

The method may determine the leakage or the loss of vacuum when the shield voltage is within a second predetermined amount of the line side voltage.

The method may determine that the separable contacts of the vacuum interrupter are intended to be closed; and output a signal representing no leakage or loss of vacuum when the shield voltage is not within a second predetermined amount of the line side voltage.

The method may determine the leakage or the loss of vacuum when the shield voltage is within a second predetermined amount of the line side voltage.

As another aspect of the invention, a method monitors a vacuum interrupter for leakage or loss of vacuum. The vacuum interrupter includes a first side, a second side, a shield, and separable contacts electrically connected between the first side and the second side, the first side having a first voltage, the second side having a second voltage, the shield having a shield voltage. The method comprises: determining whether the separable contacts of the vacuum interrupter are intended to be open or closed; comparing the shield voltage to at least one of the first voltage and the second voltage; and determining the leakage or the loss of vacuum when the separable contacts of the vacuum interrupter are intended to be closed and when the shield voltage is within a predetermined amount of at least one of the first voltage and the second voltage.

The method may employ as the first side a line side of the vacuum interrupter; employ as the first voltage a line side voltage; compare the shield voltage to the line side voltage; and determine the leakage or the loss of vacuum when the separable contacts of the vacuum interrupter are intended to be closed and when the shield voltage is within the predetermined amount of the line side voltage.

The method may employ as the second side a load side of the vacuum interrupter; employ as the second voltage a load side voltage; compare the shield voltage to the load side voltage; and determine the leakage or the loss of vacuum when the separable contacts of the vacuum interrupter are intended to be closed and when the shield voltage is within the predetermined amount of the load side voltage.

The method may determine a maximum voltage from the first voltage and the second voltage; compare the shield voltage to the maximum voltage; and determine the leakage or the loss of vacuum when the shield voltage is within the predetermined amount of the maximum voltage.

The method may output a signal representing no leakage or loss of vacuum when the separable contacts of the vacuum interrupter are intended to be open and when the shield voltage is not within the predetermined amount of at least one of the first voltage and the second voltage.

As another aspect of the invention, a vacuum circuit breaker comprises: a first terminal having a first voltage; a second terminal having a second voltage; a vacuum switch comprising a vacuum envelope containing a fixed contact assembly and a movable contact assembly movable between a closed circuit position in electrical communication with the fixed contact assembly and an open circuit position spaced apart from the fixed contact assembly, the fixed contact assembly electrically interconnected with the first terminal, the vacuum envelope including a shield having a shield voltage; means for electrically connecting the movable contact assembly to the second terminal; an operating mechanism adapted to move the movable contact assembly between the closed circuit position and the open circuit position, the operating mechanism including an auxiliary contact representative of whether the fixed contact assembly and the movable contact assembly are intended to be in the open circuit position or the closed circuit position; and a circuit adapted to determine leakage or loss of vacuum of the vacuum envelope when the separable contacts of the vacuum interrupter are intended to be open and when the first voltage is within a first predetermined amount of the second voltage, or when the separable contacts of the vacuum interrupter are intended to be closed and when the shield voltage is within a second predetermined amount of at least one of the first voltage and the second voltage.

As another aspect of the invention, a monitoring circuit for a vacuum switch including a vacuum envelope containing a fixed contact assembly having a first voltage, a movable contact assembly having a second voltage and an auxiliary contact representative of whether the fixed contact assembly and the movable contact assembly are intended to be in the open circuit position or the closed circuit position, the movable contact assembly being movable between a closed circuit position in electrical communication with the fixed contact assembly and an open circuit position spaced apart from the fixed contact assembly, the vacuum envelope including a shield having a shield voltage. The monitoring circuit comprises: a circuit adapted to determine leakage or loss of vacuum of the vacuum envelope when the separable contacts of the vacuum interrupter are intended to be open and when the first voltage is within a first predetermined amount of the second voltage, or when the separable contacts of the vacuum interrupter are intended to be closed and when the shield voltage is within a second predetermined amount of at least one of the first voltage and the second voltage.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

The invention is disclosed in connection with a pole of a medium voltage vacuum circuit breaker, although the invention is applicable to a wide range of vacuum interrupters including any number of poles.

Figure 1:
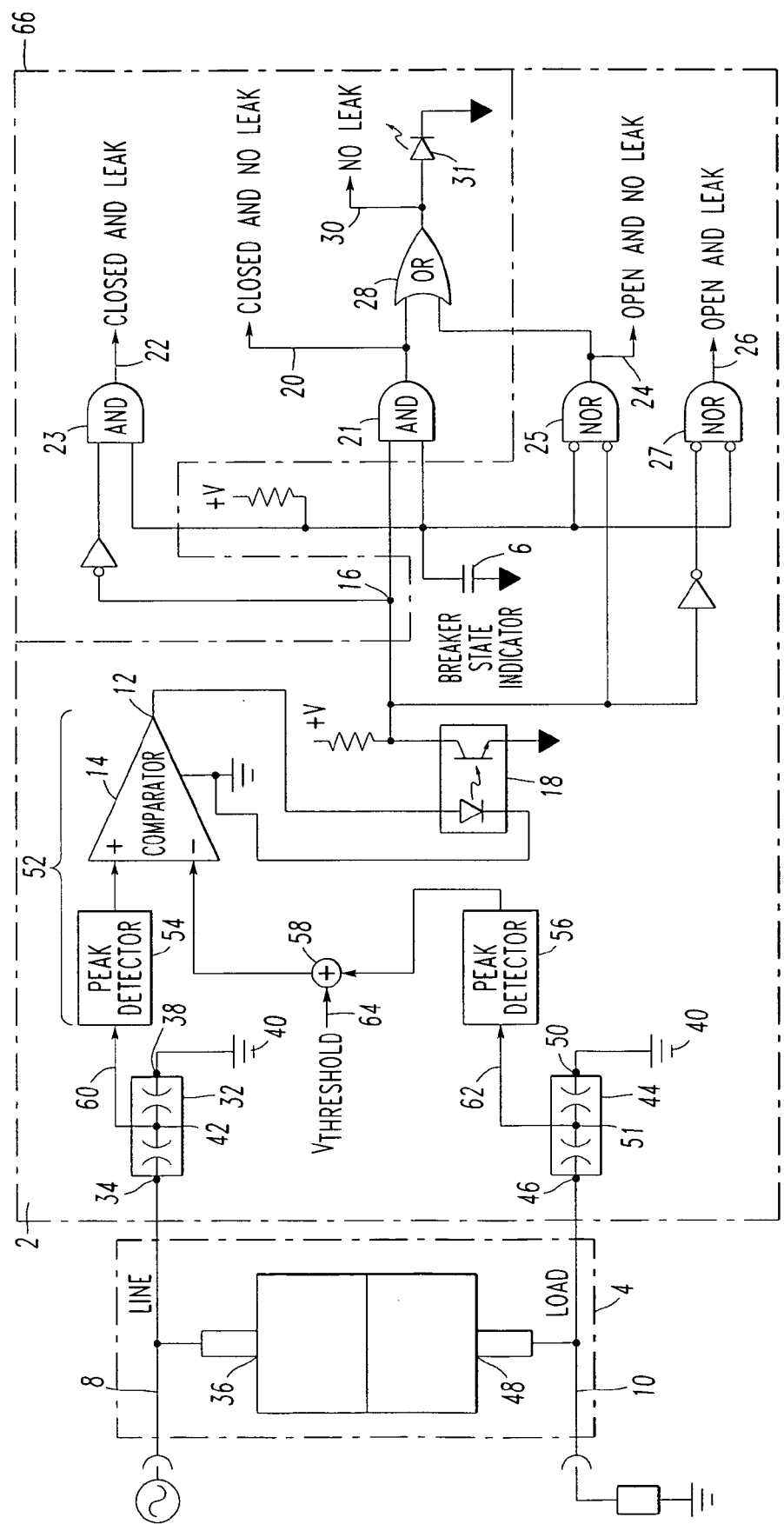
FIG. 1 is a block diagram in schematic form of a circuit for monitoring a medium voltage vacuum interrupter for leakage or loss of vacuum in accordance with the present invention.

Referring to FIG. 1, a circuit 2 monitors a medium voltage vacuum interrupter 4 for leakage or loss of vacuum. With the interrupter 4 closed, an associated breaker state indicator, such as auxiliary contact 6, is normally open. Unless the line side voltage 8 is significantly greater than the load side voltage 10, then the output 12 of the comparator 14 is normally low and the output 16 of the optical isolator 18 is normally high. As a result, the CLOSED AND NO LEAK signal 20 output by the AND gate 21 is normally high, and the CLOSED AND LEAK signal 22 output by the AND gate 23 is normally low.

The circuit 2 is advantageously employed to monitor the open state of the interrupter 4 for significant leakage or loss of vacuum. With the interrupter 4 open, the auxiliary contact 6 is closed. Under normal conditions, with no significant leakage or loss of vacuum, the line side voltage 8 (e.g., voltage=V) is significantly greater than the load side voltage 10 (e.g., voltage=0 or ≈0 because of capacitance in the insulation system of the circuit breaker (not shown) or other elements of the corresponding power circuit). As a result, the output 12 of the comparator 14 is high and the output 16 of the optical isolator 18 is low. Therefore, the OPEN AND NO LEAK signal 24 output by the NOR gate 25 is high and the OPEN AND LEAK signal 26 output by the NOR gate 27 is low. The signals 20,24 are combined by the OR gate 28 to provide a NO LEAK signal 30, which may be displayed by indicator 31.

On the other hand, under abnormal conditions of significant leakage or loss of vacuum, and with the interrupter 4 being open, the line side voltage 8 is not significantly greater than the load side voltage 10. As a result, the output 12 of the comparator 14 is low and the output 16 of the optical isolator 18 is high. Therefore, the OPEN AND LEAK signal 26 output by the NOR gate 27 is high and the OPEN AND NO LEAK signal 24 output by the NOR gate 25 is low.

The circuit 2 includes a first capacitive divider 32 having a first node 34 electrically connected to a fixed contact assembly 36 of the vacuum interrupter 4, a second node 38 electrically connected to a ground reference 40 and a first center tap 42 between the first and second nodes 34,38. A second capacitive divider 44 has a third node 46 electrically connected to a movable contact assembly 48 of the vacuum interrupter 4, a fourth node 50 electrically connected to the ground reference 40 and a second center tap 51 between the third and fourth nodes 46,50.

An alternating current voltage comparator 52 includes two peak detectors 54,56, a summer 58 and the comparator 14. The comparator 52 is adapted to compare a first alternating current voltage signal 60 at the first center tap 42 representative of the line side voltage 8 at the first node 34 and a second alternating current voltage signal 62 at the second center tap 51 representative of the load side voltage 10 at the third node 46. The comparator output 12 is high when the peak of the first alternating current voltage signal 60, as captured by the peak detector 54, is greater than the peak of the second alternating current voltage signal 62, as captured by the peak detector 56, by more than a suitable predetermined threshold voltage ($V_{THRESHOLD}$) 64. The peak detectors 54,56 may maintain the corresponding peak voltages for a suitable time period (e.g., without limitation, about one line cycle; several line cycles; substantially continuously; any suitable time period).

Figure 6:
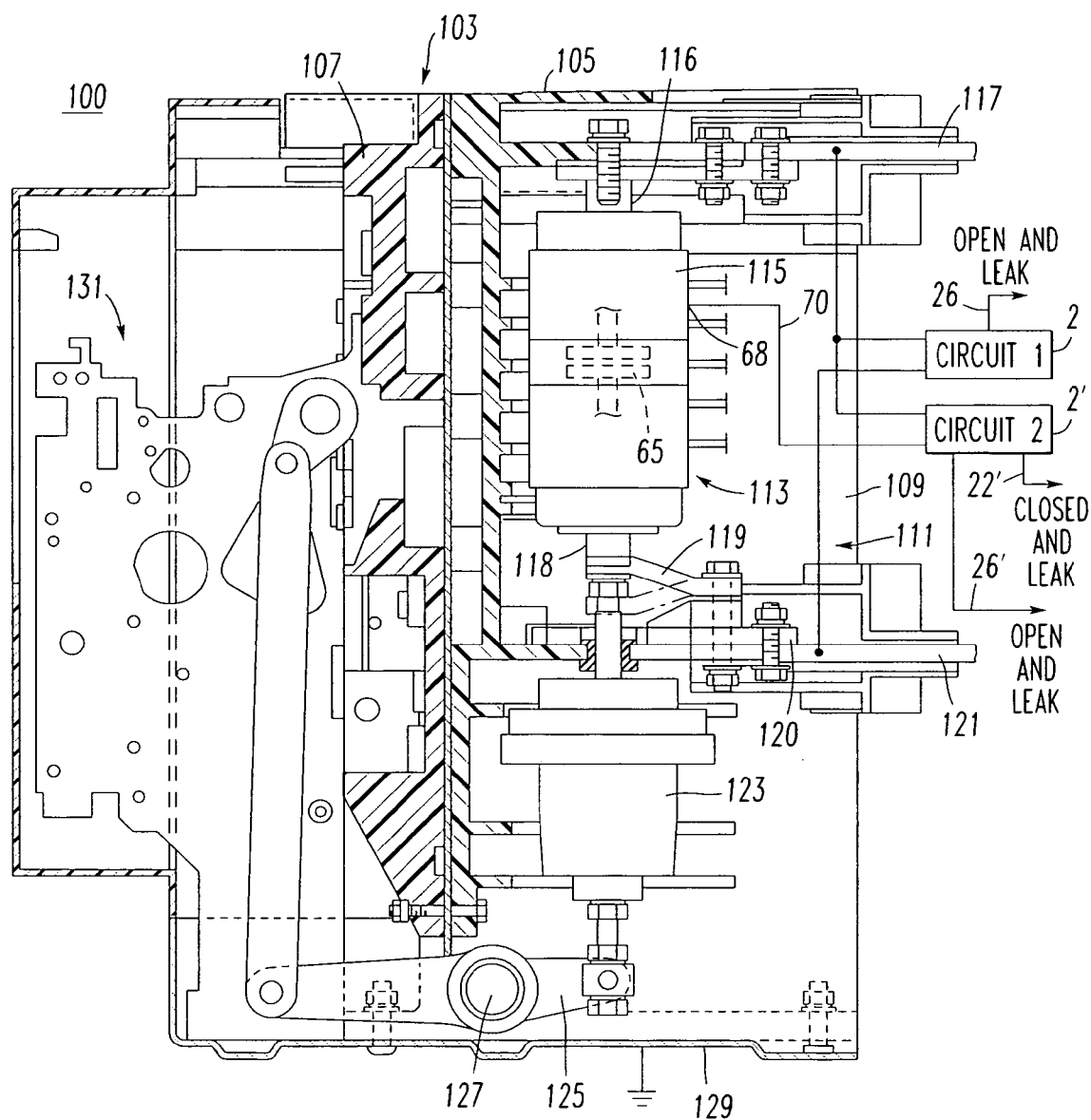
FIG. 6 is a longitudinal vertical section of a medium voltage vacuum circuit breaker including the circuits of FIGS. 1 and 2 in accordance with another embodiment of the invention.

The circuit 2 may advantageously be employed to determine significant leakage or loss of vacuum of the interrupter 4. The circuit 2 employs the auxiliary contact 6 to determine whether the separable contacts 65 (e.g., as shown in FIG. 6) of the interrupter 4 are intended to be open or closed. The comparator circuit 52 compares the line side voltage 8 to the load side voltage 10. The circuit 2 determines that there is significant leakage or the loss of vacuum of the interrupter 4 when the separable contacts 65 are intended to be open and when the load side voltage 10 is within a predetermined amount (e.g., without limitation, the voltage difference is about 5 to about 20 percent; about 0 to about 30 percent) of the line side voltage 8. Based upon that predetermined amount, the nominal line side voltage 8 and the impedances of the dividers 32,44, the threshold voltage 64 is readily predetermined by one of ordinary skill in the art.

For consideration of the intended open state of the interrupter 4, the portion 66 of the circuit 2 is not employed. That circuit portion 66 may, in some circumstances, determine loss of vacuum when the interrupter 4 is intended to be closed. In that event, the line side voltage 8 may be greater than the load side voltage 10 by greater than the predetermined amount. Normally, however, the circuit portion 66 would be employed to detect a "stuck open" condition of the interrupter 4 that might result from some other failure mechanism other than leakage or loss of vacuum.

Figure 2:
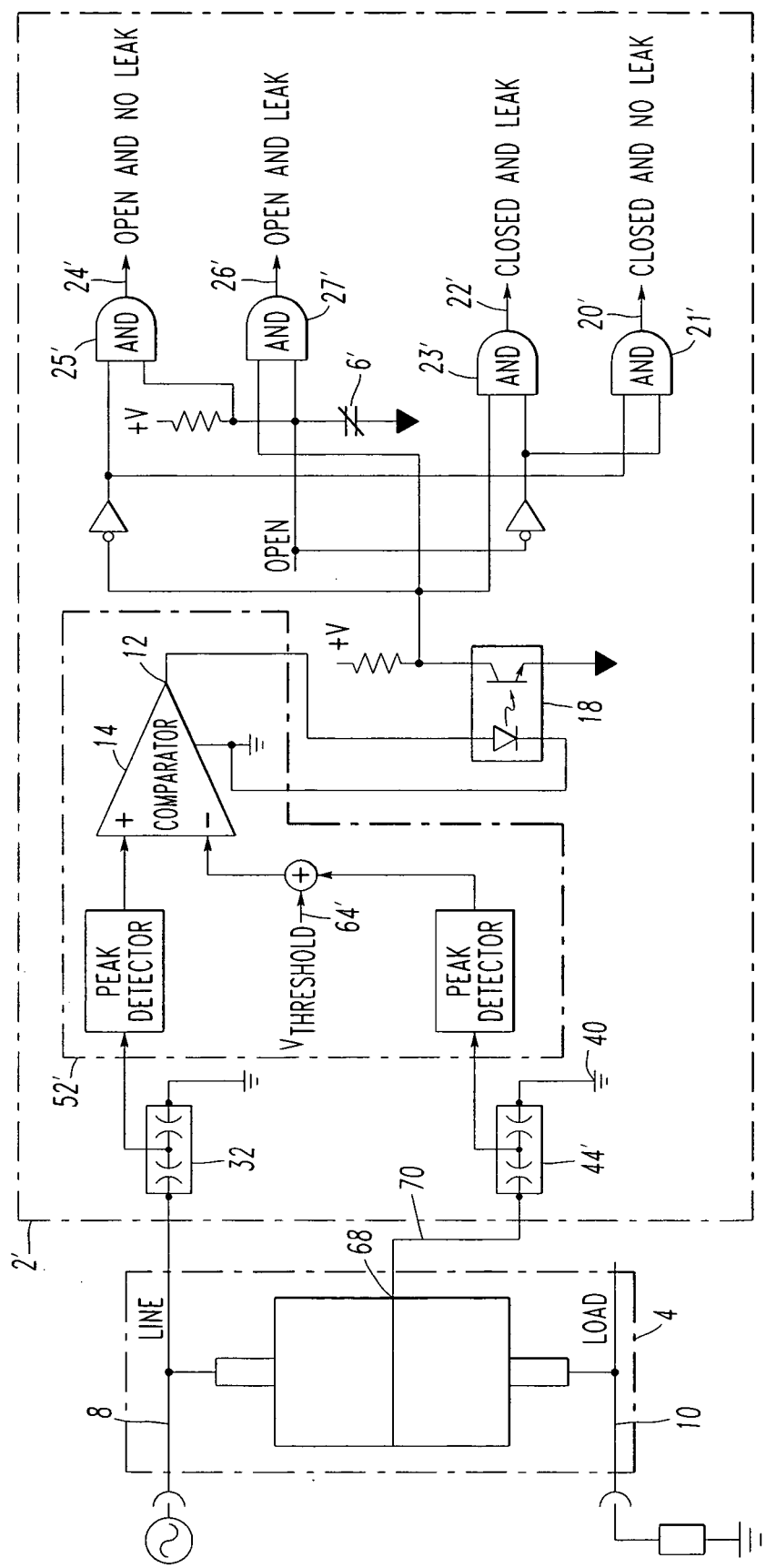
FIG. 2 is a block diagram in schematic form of a circuit for monitoring a medium voltage vacuum interrupter for leakage or loss of vacuum in accordance with another embodiment of the invention.

FIG. 2 shows another circuit 2' for monitoring the medium voltage vacuum interrupter 4 for leakage or loss of vacuum. The circuit 2' is somewhat similar to the circuit 2 of FIG. 1, although a second capacitive divider 44' is employed in connection with a center-shield 68 of the interrupter 4 and four AND gates 21',23',25',27' are employed to output respective signals 20',22',24',26'. The circuit 2' may advantageously be employed to determine significant leakage or loss of vacuum of the interrupter 4 for the intended open state thereof as determined by auxiliary contact 6', which is open whenever the interrupter 4 is in the intended open state, and for the intended closed state thereof as determined by auxiliary contact 6', which is closed whenever the interrupter 4 is in the intended closed state.

The circuit 2' detects significant leakage or loss of vacuum of the interrupter 4 (e.g., a "leaker") by comparing the shield voltage 70 on the floating shield 68 with the voltage at one end (e.g., the line side voltage 8) of the interrupter 4. Preferably, a suitably high impedance connection is provided from the shield 68 to ground 40 by the capacitive divider 44'. Alternatively, any suitable external impedance (e.g., resistor; capacitor; resistor and capacitor), may be employed in order to conduct a relatively small current.

If the vacuum of the vacuum interrupter 4 begins to fail, then that reduced vacuum will begin to conduct and current will begin to flow from the source (e.g., the line side voltage 8) to the shield 68 and through the impedance of the capacitive divider 44'. This pulls the shield voltage 70 closer to the line side voltage 8. A relatively poorer vacuum results in relatively greater shield current and, thus, a relatively higher shield voltage 70.

If the vacuum interrupter 4 is closed, then the line side voltage 8 normally equals the load side voltage 10. In this case, it does not matter whether the comparison is between the line side voltage 8 and the shield voltage 70, or between the load side voltage 10 and the shield voltage 70. In this example of FIG. 2, the line side voltage 8 is employed.

In the event that the vacuum is "poor" (e.g., vacuum envelope pressure>$10^{-2}$ torr) and the vacuum interrupter 4 is a "leaker," then the external impedance (e.g., of the capacitive divider 44') will conduct a relatively small current. Hence, if the line voltage 8 (e.g., line voltage=V) is about the same as the shield voltage 70 (e.g., shield voltage≈V), then the vacuum interrupter 4 is a "leaker".

In the event that the vacuum is "marginal" (e.g., vacuum envelope pressure<$10^{-2}$ torr), then the external impedance will conduct relatively less current, in order that the shield voltage 70 falls into a questionable range (e.g., 0+Δ<shield voltage<V−Δ, wherein Δ is a suitable predetermined voltage), then the vacuum interrupter 4 is "marginal".

In the event that the vacuum is "good" (e.g., vacuum envelope pressure<$10^{-3}$ torr), then the external impedance will conduct relatively minimal current, in order that the shield voltage 70 is sufficiently close to zero (e.g., shield voltage<Δ, wherein Δ is a predetermined voltage; shield voltage<<V), then the vacuum interrupter 4 is "good".

Functionally, if the interrupter 4 is closed, then the line side voltage 8 is normally insignificantly greater than the load side voltage 10 and the shield voltage 70 is below a threshold value (e.g., Δ; a percentage of the line side voltage 8; a percentage of the load side voltage 10), and the CLOSED AND NO LEAK signal 20' is active. Otherwise, the presence of a suitably high shield voltage 70 on the floating shield 68, while either the line side voltage 8 or the load side voltage 10 is energized, indicates that the interrupter 4 may have at least a partial loss of vacuum.

On the other hand, if the interrupter 4 is open, then the line side voltage 8 is normally significantly greater than the load side voltage 10 and the shield voltage 70 is normally below a threshold value (e.g., Δ; a percentage of the line side voltage 8), and the OPEN AND NO LEAK signal 24' is active. Otherwise, the presence of a suitably high shield voltage 70 on the floating shield 68, while the line side voltage 8 is energized, indicates that the interrupter 4 may have at least a partial loss of vacuum.

The circuit 2' advantageously monitors the medium voltage vacuum interrupter 4 for leakage or loss of vacuum. The auxiliary contact 6' determines whether the interrupter 4 is intended to be open or closed. The comparator circuit 52' compares the line side voltage 8 to the shield voltage 70. The circuit 2' determines that there is significant leakage or the loss of vacuum of the interrupter 4 when the separable contacts 65 (FIG. 6) are intended to be closed and when the shield voltage 70 is within a predetermined amount (e.g., without limitation, the voltage difference is about 5 to about 20 percent; about 0 to about 30 percent) of the line side voltage 8. Based upon that predetermined amount, the nominal line side voltage 8 and the impedances of the dividers 32,44', the threshold voltage 64' is readily predetermined.

Whenever the vacuum interrupter 4 is intended to be open, the AND gate 25' outputs the OPEN AND NO LEAK signal 24' representing no leakage or loss of vacuum when the shield voltage 70 is not within that predetermined amount of the line side voltage 8. Similarly, when the vacuum interrupter 4 is intended to be closed, the AND gate 21' outputs the CLOSED AND NO LEAK signal 20' representing no leakage or loss of vacuum when the shield voltage 70 is not within that predetermined amount of the line side voltage 8.

On the other hand, for significant leakage or loss of vacuum conditions, whenever the vacuum interrupter 4 is intended to be open, the AND gate 27' outputs the OPEN AND LEAK signal 26' representing leakage or loss of vacuum when the shield voltage 70 is within that predetermined amount of the line side voltage 8. Similarly, when the vacuum interrupter 4 is intended to be closed, the AND gate 23' outputs the CLOSED AND LEAK signal 22' representing leakage or loss of vacuum when the shield voltage 70 is within that predetermined amount of the line side voltage 8.

Figure 3:
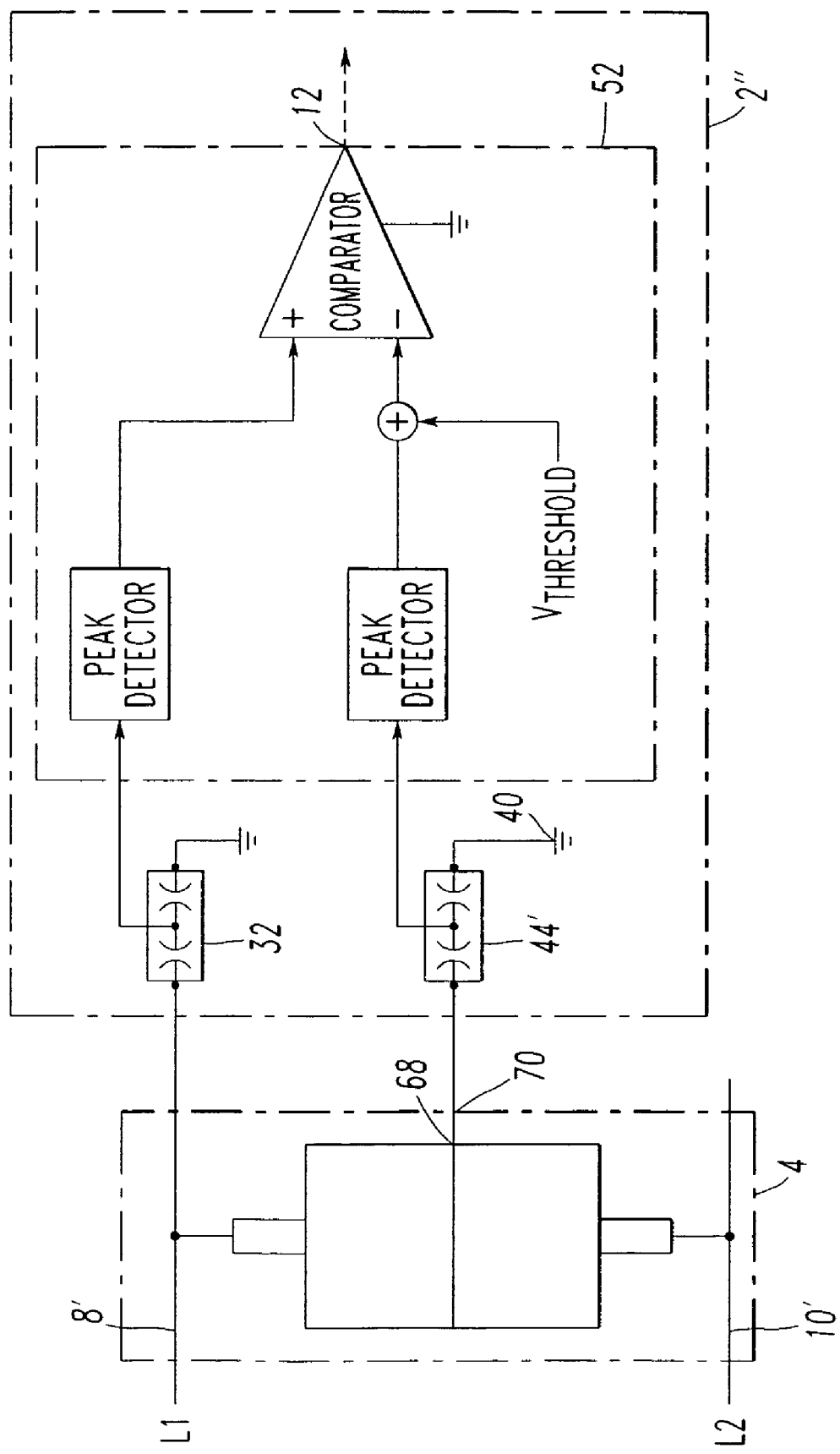
FIG. 3 is a block diagram in schematic form of a circuit for monitoring a medium voltage vacuum interrupter for leakage or loss of vacuum using a first or line side voltage and a shield voltage in accordance with another embodiment of the invention.

FIG. 3 shows a circuit 2" for monitoring the vacuum interrupter 4 for leakage or loss of vacuum when the interrupter is closed. This circuit 2" employs the optical isolator 18 and the portion of the logic of FIG. 2 including the AND gates 21' and 23' that provide the respective CLOSED AND NO LEAK signal 20' and CLOSED AND LEAK signal 22'. Here, depending upon the application of the corresponding circuit breaker (not shown), the first voltage L1 8' may be either a line side voltage or a load side voltage and the second voltage L2 10' may be either a load side voltage or a line side voltage, respectively. Hence, the circuit 2" does not monitor the vacuum interrupter 4 for leakage or loss of vacuum when the interrupter is open, since if the first voltage L1 8' was a load side voltage it would not be energized when the vacuum interrupter 4 was open.

Figure 4:
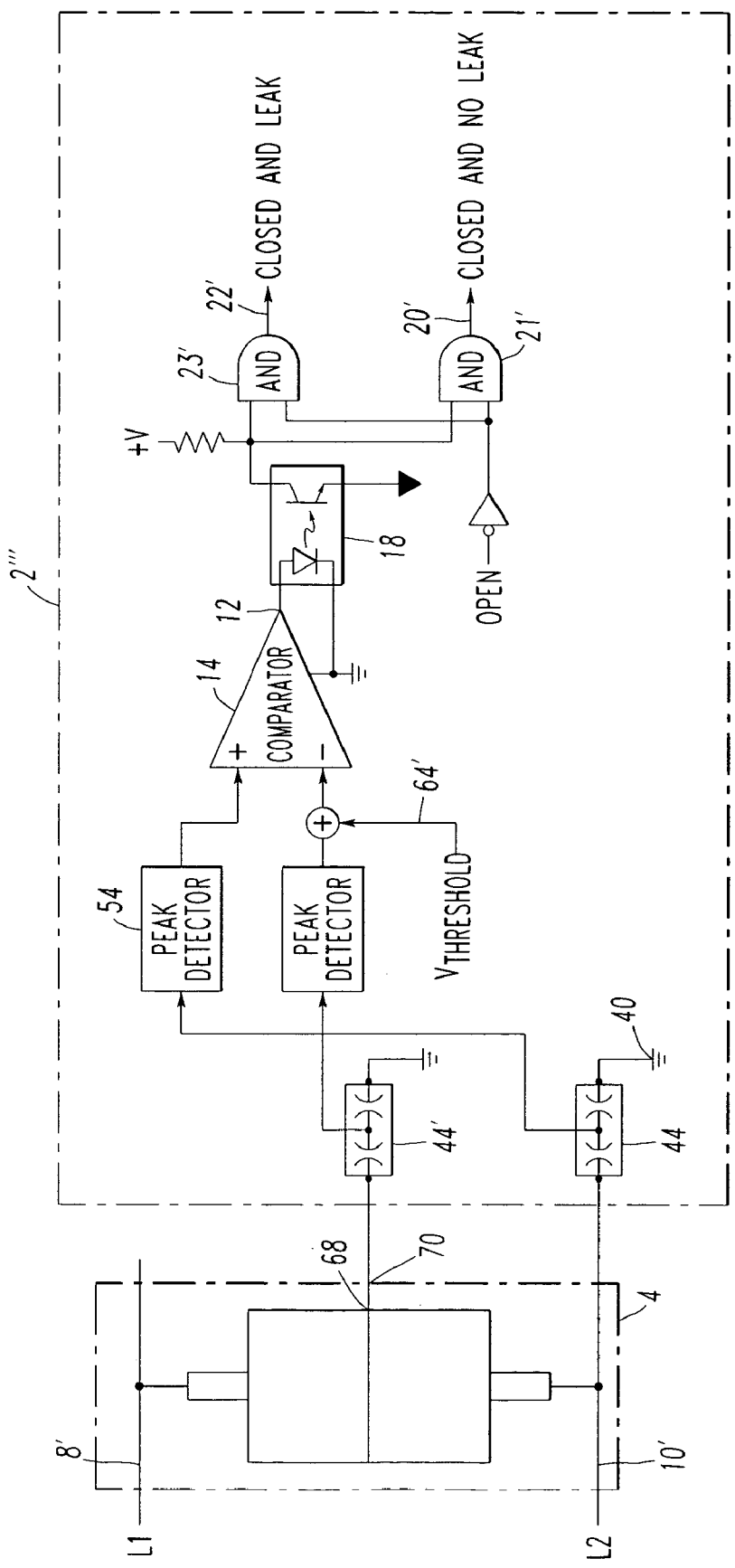
FIG. 4 is a block diagram in schematic form of a circuit for monitoring a medium voltage vacuum interrupter for leakage or loss of vacuum using a second or load side voltage and a shield voltage in accordance with another embodiment of the invention.

FIG. 4 shows a circuit 2''' for monitoring the vacuum interrupter 4 for leakage or loss of vacuum when the interrupter is closed. This circuit 2''' employs the optical isolator 18 and the portion of the logic of FIG. 2 including the AND gates 21' and 23' that provide the respective CLOSED AND NO LEAK signal 20' and CLOSED AND LEAK signal 22'. Here, depending upon the application of the corresponding circuit breaker (not shown), the second voltage L2 10' may be either a line side voltage or a load side voltage and the first voltage L1 8' may be either a load side voltage or a line side voltage, respectively. Hence, the circuit 2''' does not monitor the vacuum interrupter 4 for leakage or loss of vacuum when the interrupter is open, since if the second voltage L2 10' was a load side voltage it would not be energized when the vacuum interrupter 4 was open.

Figure 5:
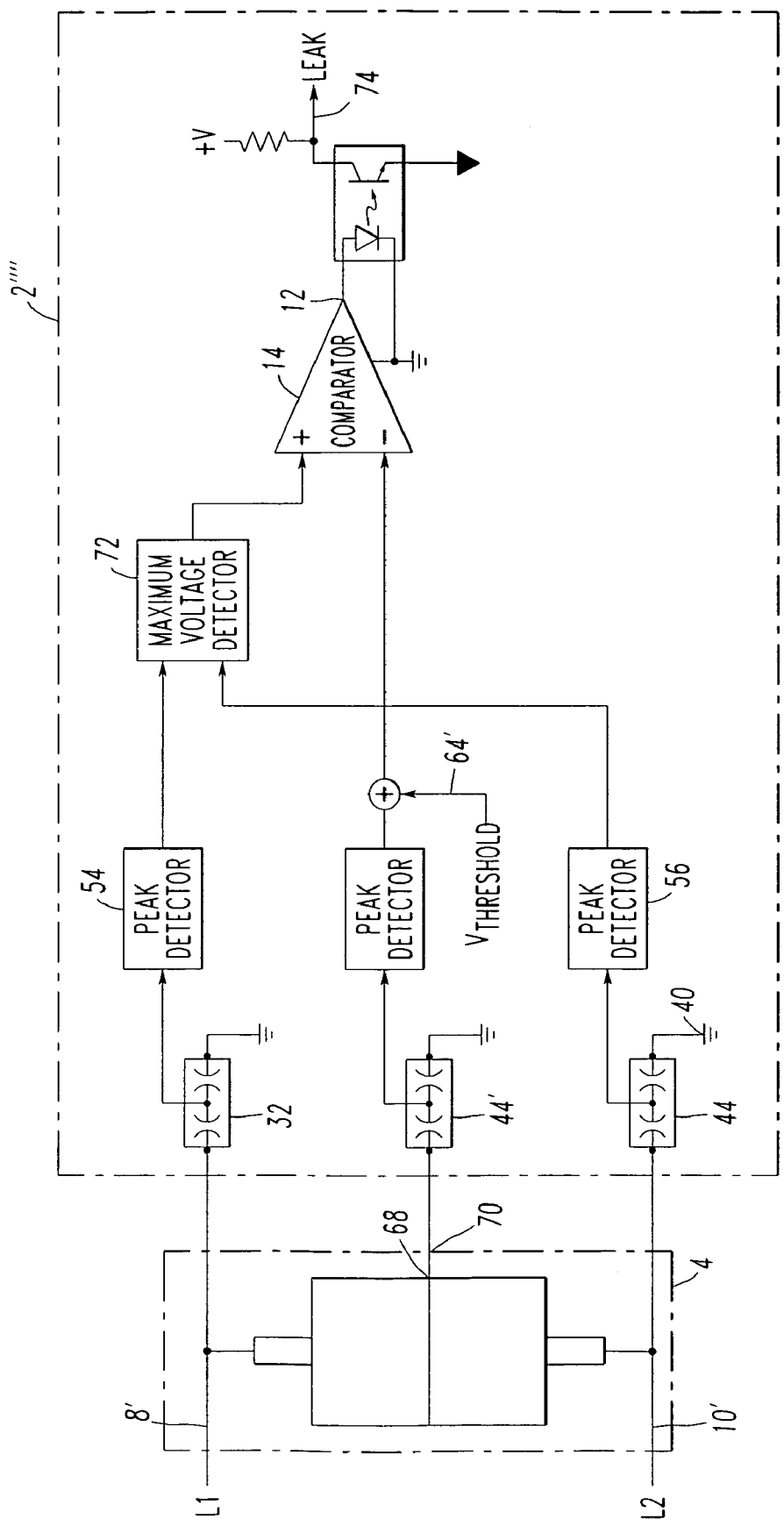
FIG. 5 is a block diagram in schematic form of a circuit for monitoring a medium voltage vacuum interrupter for leakage or loss of vacuum using a shield voltage and the maximum of a first or line side voltage and a second or load side voltage in accordance with another embodiment of the invention.

FIG. 5 shows a circuit 2'''' for monitoring the vacuum interrupter 4 for leakage or loss of vacuum regardless whether the interrupter is open or closed. This circuit 2'''' employs the shield voltage 70 and a maximum voltage detector 72 to determine the maximum peak of the first voltage (L1) 8' and the second voltage (L2) 10'. In this example, either end of the vacuum interrupter 4 could be connected to the source voltage. This could occur for example, in the case of a "tie" circuit breaker application. In that event, for the open state, the circuit 2" of FIG. 3 and the circuit 2''' of FIG. 4 do not know which terminal of the vacuum interrupter 4 is energized and which terminal is de-energized. Here, however, the shield voltage 70 is preferably compared to the higher peak voltage of the first voltage (L1) 8' and the second voltage (L2) 10'. The leak signal 74 is independent of whether the vacuum interrupter 4 is open or closed (or intended to be open or closed), although the additional logic of FIG. 2 or 4 may be employed.

In the event of a "tie" circuit breaker application or a "generator" circuit breaker application, instead of "source" and "load" terminals, there are "Source #1" and "Source #2" terminals. Normally, most of the time, Source #2 is either 0 V or equal to and in phase with Source #1. In the special case where Source #2 is completely out-of-phase with Source #1, then the circuit 2'''' would probably not work, since the current between Source #1 and the shield 70 would be cancelled by the current flowing between Source #2 and the shield 70. However, if Source #2 were only partially out-of-phase with Source #1, then the circuit 2'''' may work, albeit with reduced accuracy.

FIG. 6 shows a vacuum circuit breaker 100 including one or both of the circuits 2,2' of FIGS. 1 and 2. The three-pole (only one pole is shown in FIG. 6) power vacuum circuit breaker 100 includes a molded insulative casing 103 divided into a rear section 105 and a forward section 107. An example of the circuit breaker 100, excluding the circuits 2,2', is disclosed in U.S. Pat. No. 6,373,358, which is incorporated by reference herein. The rear casing 105 is preferably molded as a single piece with a plurality of pole cavities 109 (one of which is shown in FIG. 6). The circuit breaker 100 has three such pole cavities (only one cavity 109 is shown in FIG. 6), one for each phase of a three-phase power distribution system (not shown). Each of the pole cavities 109 houses a pole mechanism 111, which includes a suitable vacuum switch, such as vacuum interrupter 113 as is shown in FIG. 6.

Each of the vacuum interrupters 113 has separable contacts 65 housed in a vacuum envelope, such as bottle 115. The upper or fixed contact of the separable contacts 65 is electrically connected at first terminal 116 to a line conductor 117, which extends rearward for connection to a utility bus (not shown). The lower, or moveable, contact of the separable contacts 65 is electrically connected at terminal 118 by a flexible shunt 119 to a second terminal 120 for a load conductor 121, which likewise extends rearward for connection to a load bus (not shown). Although a flexible shunt 119 is shown, any suitable mechanism or circuit for electrically connecting the movable contact to the second terminal 120 may be employed. The moveable contact is mechanically connected through an insulator/compression spring 123, which provides electrical isolation and a spring bias, to an operating linkage in the form of a bell crank 125 of a pole shaft 127. The moveable contact is movable between a closed circuit position in electrical communication with the fixed contact and an open circuit position spaced apart from the fixed contact. The bell crank 125 is pivotally mounted in an electrically conductive pan 129 which extends under the molded insulative casing 103.

An operating mechanism 131 including the pole shaft 127 is adapted to move the movable contact assembly between the closed circuit position and the open circuit position. The operating mechanism 131 includes the breaker state indicator 6 of FIG. 1, which indicates whether the fixed contact and movable contact assemblies are intended to be in the open circuit position or the closed circuit position.

EXAMPLE 1

In the circuit breaker 100, the source of the breaker state indicator 6 (FIG. 1) is a conventional output from an auxiliary circuit contact (e.g., contact closed or low for the circuit breaker being open; contact open or high for the circuit breaker being closed).

EXAMPLE 2

Existing circuit breakers have several different ways of indicating the circuit breaker state of closed or open. One example is an electro-mechanical indicator called the auxiliary switch. The auxiliary switch consists of "normally open" and/or "normally closed" contacts mounted in the circuit breaker that open or close whenever the breaker is opened or closed. A mechanical linkage, which is connected to the pole shaft 127 of the circuit breaker 100, interacts with a knife blade type switch (not shown) to change states. Therefore, wires and/or other devices can be connected to this device in order to indicate mechanically and/or electronically the state of the circuit breaker 100.

EXAMPLE 3

During fault current interruption, the resulting arc can actually "hit" the shield 68 (FIG. 2), which would give the same result as a "leaker" for several milliseconds. Therefore, the circuits 2,2',2",2'",2"" are preferably turned "off" for a suitable period (e.g., without limitation, several milliseconds; several minutes) (depending upon the circuit) during switching operations.

EXAMPLE 4

As an alternative to Example 3, the outputs of the circuits 2',2",2'",2"" are ignored during the interruption process.

EXAMPLE 5

As an alternative to Examples 3 and 4, the AC comparator 52' (FIG. 2) is suitably filtered to respond in about 1 to about 100 milliseconds.

EXAMPLE 6

As an alternative to the external shield impedance 44' (FIG. 2), the local impedance of certain pole units (e.g., resulting from stray capacitance within the pole unit and/or the vacuum interrupter 4) might be sufficient such that the external shield impedance is not required.

EXAMPLE 7

The circuits 2,2',2",2'",2"" may be integrally mounted within a vacuum circuit breaker, such as 100 (FIG. 6), to sense the loss, or partial loss, of vacuum from inside the vacuum interrupter 4 (FIG. 1) or 113 (FIG. 6). Preferably, those circuits are suitably insulated to avoid voltage breakdown issues (BIL test requirement).

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A vacuum circuit breaker comprising:
a first terminal having a first voltage;
a second terminal having a second voltage;
a vacuum switch comprising a vacuum envelope containing a fixed contact assembly and a movable contact assembly movable between a closed circuit position in electrical communication with the fixed contact assembly and an open circuit position spaced apart from the fixed contact assembly, said fixed contact assembly electrically interconnected with said first terminal, said vacuum envelope including a shield having a shield voltage;
means for electrically connecting said movable contact assembly to said second terminal;
an operating mechanism adapted to move said movable contact assembly between the closed circuit position and the open circuit position, said operating mechanism including an auxiliary contact representative of whether the fixed contact assembly and the movable contact assembly are intended to be in the open circuit position or the closed circuit position;
a circuit adapted to determine leakage or loss of vacuum of said vacuum envelope when said separable contacts of said vacuum interrupter are intended to be open and when said first voltage is within a first predetermined amount of said second voltage, or when said separable contacts of said vacuum interrupter are intended to be closed and when said shield voltage is within a second predetermined amount of at least one of said first voltage and said second voltage; and
wherein said circuit includes a first capacitive divider having a first node electrically connected to said fixed contact assembly, a second node electrically connected to a ground reference and a first center tap between said first and second nodes, a second capacitive divider having a third node electrically connected to said movable contact assembly, a fourth node electrically connected to said ground reference and a second center tap between said third and fourth nodes, an alternating current voltage comparator adapted to compare a first alternating current voltage signal at said first center tap representative of said first voltage at said first node and a second alternating current voltage signal at said second center tap representative of said second voltage at said third node and to output a first logic signal when said first alternating current voltage signal is greater then said second alternating current voltage signal by greater then a threshold value representative of said first predetermined amount; wherein said auxiliary contact outputs a second logic signal representative of the fixed contact assembly and the movable contact assembly being intended to be in the open circuit position; and wherein said further includes an AND gate having a first input of said first logic signal, a second input of said second logic signal and an output having a first signal representing no leakage or loss of vacuum, a NOR gate having first input of said first logic signal, a second input of said second logic signal and an output having a second signal representing no leakage or loss of vacuum, and an OR gate having first input of said first signal representing no leakage or loss of vacuum, a second input of said second signal representing no leakage or loss of vacuum and an output having a signal representative of no leakage or loss of vacuum of said vacuum envelope.

2. The vacuum circuit breaker of claim 1 wherein said circuit further includes a third capacitive divider having a fifth node electrically connected to said shield, a sixth node electrically connected to said ground reference and a third center tap between said fifth and sixth nodes; wherein said alternating current voltage comparator is a first alternating current voltage comparator; wherein said threshold value is a first threshold value and said predetermined amount is a first predetermined amount; wherein said circuit further includes a second alternating current voltage comparator adapted to compare a third alternating current voltage signal at said third center tap representative of said shield voltage at said fifth node and said first alternating current voltage signal at said first center tap representative of said first voltage at said first node and to set said first logic signal false when said third alternating current voltage signal is within a second threshold value of said first alternating current signal, said second threshold value representative of a second predetermined amount of said first alternating current voltage signal.

\* \* \* \* \*